United States Patent
Miller et al.

(10) Patent No.: US 10,386,206 B2
(45) Date of Patent: Aug. 20, 2019

(54) ACTIVE MIRRORING CAPACITANCE MONITORING SYSTEM FOR FURNITURE

(71) Applicant: L&P PROPERTY MANAGEMENT COMPANY, South Gate, CA (US)

(72) Inventors: Eric D. Miller, Olathe, KS (US); Braden Berziel, Joplin, MO (US); Vino Gopalakrishnan, Carthage, MO (US); Jonathan Kaufmann, San Antonio, TX (US); Douglas E. Conyers, San Antonio, TX (US)

(73) Assignee: L&P PROPERTY MANAGEMENT COMPANY, South Gate, CA (US)

( * ) Notice: Subject to any disclaimer, the term of this patent is extended or adjusted under 35 U.S.C. 154(b) by 368 days.

(21) Appl. No.: 15/422,472

(22) Filed: Feb. 2, 2017

(65) Prior Publication Data

US 2018/0216970 A1    Aug. 2, 2018

(51) Int. Cl.
*H03B 1/00* (2006.01)
*G06F 1/00* (2006.01)
*G01D 5/24* (2006.01)

(52) U.S. Cl.
CPC .................. *G01D 5/24* (2013.01); *G06F 1/00* (2013.01); *H03B 1/00* (2013.01)

(58) Field of Classification Search
CPC ......... G06F 1/00; G06F 2101/00; H03B 1/00; H03B 2200/00; G01R 1/00
See application file for complete search history.

(56) References Cited

U.S. PATENT DOCUMENTS

| | | | |
|---|---|---|---|
| 2005/0122119 A1 | 6/2005 | Barlow | |
| 2006/0109538 A1* | 5/2006 | Mushika | G02B 26/0841 359/291 |
| 2011/0102241 A1* | 5/2011 | Stewart | G01S 7/034 342/104 |
| 2013/0176040 A1* | 7/2013 | Rohr | H03K 17/955 324/686 |
| 2015/0137835 A1 | 5/2015 | Chacon et al. | |
| 2015/0206598 A1 | 7/2015 | Enjalbert | |
| 2016/0084487 A1 | 3/2016 | Chacon et al. | |
| 2016/0128628 A1 | 5/2016 | Chen | |

OTHER PUBLICATIONS

International Search Report and Written Opinion dated Mar. 8, 2018 in International Patent Application No. PCT/US17/68099, 12 pages.

* cited by examiner

*Primary Examiner* — Jermele M Hollington
*Assistant Examiner* — Temilade S Rhodes-Vivour
(74) *Attorney, Agent, or Firm* — Shook, Hardy & Bacon, L.L.P.

(57) ABSTRACT

A system, method, and apparatus for active-mirroring, capacitive monitoring of furniture are provided. More particularly, the invention relates to an active mirroring system for a furniture item that monitors a first sensor type over a first frequency, while applying an inverse first frequency to at least one other sensor type coupled to the same furniture item. As such, the additional sensor types receiving the inverse sampling frequency may be dampened and/or cancelled, thereby preventing interference during monitoring of the first sensor type. In further aspects, a monitoring and mirroring cycle is provided, for sequentially monitoring and mirroring capacitive sensing mechanisms on different portions of a common furniture item.

20 Claims, 8 Drawing Sheets

ACTIVE MIRRORING CAPACITANCE MONITORING SYSTEM FOR FURNITURE

CROSS-REFERENCE TO RELATED APPLICATIONS

None.

STATEMENT REGARDING FEDERALLY SPONSORED RESEARCH OR DEVELOPMENT

Not applicable.

TECHNICAL FIELD

The present invention generally relates to a capacitive-sensing technology incorporated into furniture. More particularly, the invention relates an active-mirroring system, method, and apparatus for isolating and optimizing capacitance detection accuracy for furniture.

BACKGROUND OF THE INVENTION

Sensing mechanisms associated with furniture may be impacted by user interaction with the furniture, environment impact on the furniture, and/or other-sensor impact with the primary sensing mechanism. In some aspects, a furniture item having multiple, highly-sensitive capacitive sensors may generate interrupted monitoring data when cycling a listening frequency across multiple sensors, detecting change in monitored capacitance from a different sensor than intended. In other aspects, a sensor being used to monitor a change in capacitance over a particular sensor may inadvertently retrieve multiple false readings in response to detecting noise from other sensing mechanisms. Accordingly, a need exists for an accurate capacitive-sensing technology for use with furniture items having multiple capacitive sensors, which addresses the foregoing and other problems.

BRIEF SUMMARY OF THE INVENTION

The present invention generally relates to an apparatus for monitoring a change in capacitance associated with multiple capacitive sensors on a furniture item. It should be understood that the invention contemplates multiple capacitive detection components coupled to a furniture item, such as an occupancy sensor coupled to a bed mattress and a presence sensor coupled to a bed frame of the same bed unit. In further aspects, the invention provides an active mirroring system for monitoring a first sensor on at least one furniture item, and applying an inverse signal to at least one other sensor on the at least one furniture item, thereby providing a mirrored frequency across the at least one other sensor and maintaining uninterrupted monitoring of the first sensor from any other sensor signal associated with another sensor coupled to the same furniture item.

In additional embodiments, a first and second furniture item may be coupled together, forming a synchronized furniture system. In this embodiment, an active mirroring system may monitor a first sensor type on the first and second furniture items, while applying a mirrored frequency to additional types of sensors on the first and second furniture items. In other words, while a first pair of sensors monitoring capacitance changes across a first sensor type is actively retrieving capacitance data in association with a first monitored frequency, embodiments of the invention apply a mirrored frequency (i.e., an inverse first monitored frequency) to any additional sensors associated with the synchronized furniture items, thereby preventing cross-contamination between the first sensor type and any additional sensors.

Accordingly, in one embodiment, a method of monitoring, by a computing device having a processor and a memory, at least one capacitance change associated with a capacitive sensor of a plurality of capacitive sensors coupled to at least one furniture item, wherein the method comprises: monitoring a capacitance change associated with at least one first sensor type at a first sampling frequency, and mirroring a capacitance change associated with at least one second sensor type at an inverse first sampling frequency; monitoring a capacitance change associated with at least one second sensor type at a second sampling frequency and mirroring a capacitance charge associated with at least one first sensor type at an inverse second sampling frequency; and continuing alternating between (1) monitoring the at least one first sensor type at the first sampling frequency and mirroring the at least one second sensor type at the inverse first sampling frequency; and (2) monitoring the at least one second sensor type at the second sampling frequency and mirroring the at least one first sensor type at the inverse second sampling frequency, to provide a continuous monitoring of capacitance change with respect to the first sensor type and the second sensor type of the at least one furniture item.

In another embodiment, an active mirroring system for capacitance monitoring comprises: at least one first sensor type coupled to at least one furniture item, the at least one first sensor type comprising a first conductive component configured to monitor a change in capacitance with respect to at least a first portion of the furniture item; at least one second sensor type coupled to the at least one furniture item; the at least one second sensor type comprising a second conductive component configured to monitor a change in capacitance with respect to at least a second portion of the furniture item, said second portion separate from said first portion; and a computing device having a processor and a memory that stores instructions, wherein execution of the instructions causes the processor to: (1) apply a sampling frequency to the at least one first sensor type coupled to the at least one furniture item; (2) apply an inverse sampling frequency to the at least one second sensor type coupled to the at least one furniture item; (3) generate at least one capacitance monitoring indication from the at least one first sensor type; and (4) provide the received at least one capacitance monitoring indication to be utilized to determine whether a capacitance threshold is satisfied for the at least one first sensor type.

A further embodiment of the invention provides an active-mirroring apparatus for capacitive-sensor furniture monitoring, said active-mirroring apparatus comprising: a monitoring component for receiving an indication of change in capacitance with respect to a first capacitive sensor type coupled to each of two or more synchronized furniture items, wherein the capacitance change with respect to the first capacitive sensor type on each of the two or more synchronized furniture items is received in response to an applied first sampling frequency from the active mirroring apparatus; and an active-mirroring component for cancelling noise interference from at least one other capacitive sensor type coupled to each of the two or more synchronized furniture items during, wherein the noise interference from the at least one other capacitive sensor type is cancelled at least in part in response to an inverse first sampling frequency from the active mirroring apparatus.

Additional objects, advantages, and novel features of the invention will be set forth in part in the description which follows, and in part will become apparent to those skilled in the art upon examination of the following, or may be learned by practice of the invention.

BRIEF DESCRIPTION OF SEVERAL VIEWS OF THE DRAWINGS

The present invention is described in detail below with reference to the attached drawing figures, wherein.

DETAILED DESCRIPTION OF THE INVENTION

Aspects of the invention relate to an apparatus for monitoring a change in capacitance associated with multiple capacitive sensors on a furniture item. Further, embodiments of the invention relate to an active mirroring system for generating an uninterrupted capacitive sensing across an individual sensor in a multi-sensor detection system of a furniture item. In some instances, a sampling sensor on a furniture item is generating capacitive monitoring data while multiple other capacitive sensors coupled to different features of the furniture item are receiving a blocking signal that interrupts noise from the multiple other sensors (that would otherwise interfere with the sampling sensor. Embodiments of the invention provide a sampling signal to a first sensor type, and an inverse and/or mirrored signal to a different sensor type, such as a sampling signal provided to a furniture frame sensor and an inverse sampling signal provided to a furniture surround sensor. In further embodiments, utilizing capacitance monitoring sensors for the first sensor and the additional other sensors, if a mirrored and/or inverse sampling sensor is applied to each of the additional capacitance sensors, the system maintains uninterrupted capacitance monitoring with respect to the sensor receiving the desired capacitance indicator sample signal.

In some embodiments, the invention provides multiple capacitive detection components coupled to a furniture item, such as an occupancy sensor coupled to a bed mattress and a presence sensor coupled to a bed frame of the same bed unit. In further aspects, the invention provides an active mirroring system for monitoring a first sensor on at least one furniture item, and applying an inverse signal to at least one other sensor on the at least one furniture item, thereby providing a mirrored frequency across the at least one other sensor and maintaining uninterrupted monitoring of the first sensor from any other sensor signal associated with another sensor coupled to the same furniture item.

Figure 1:
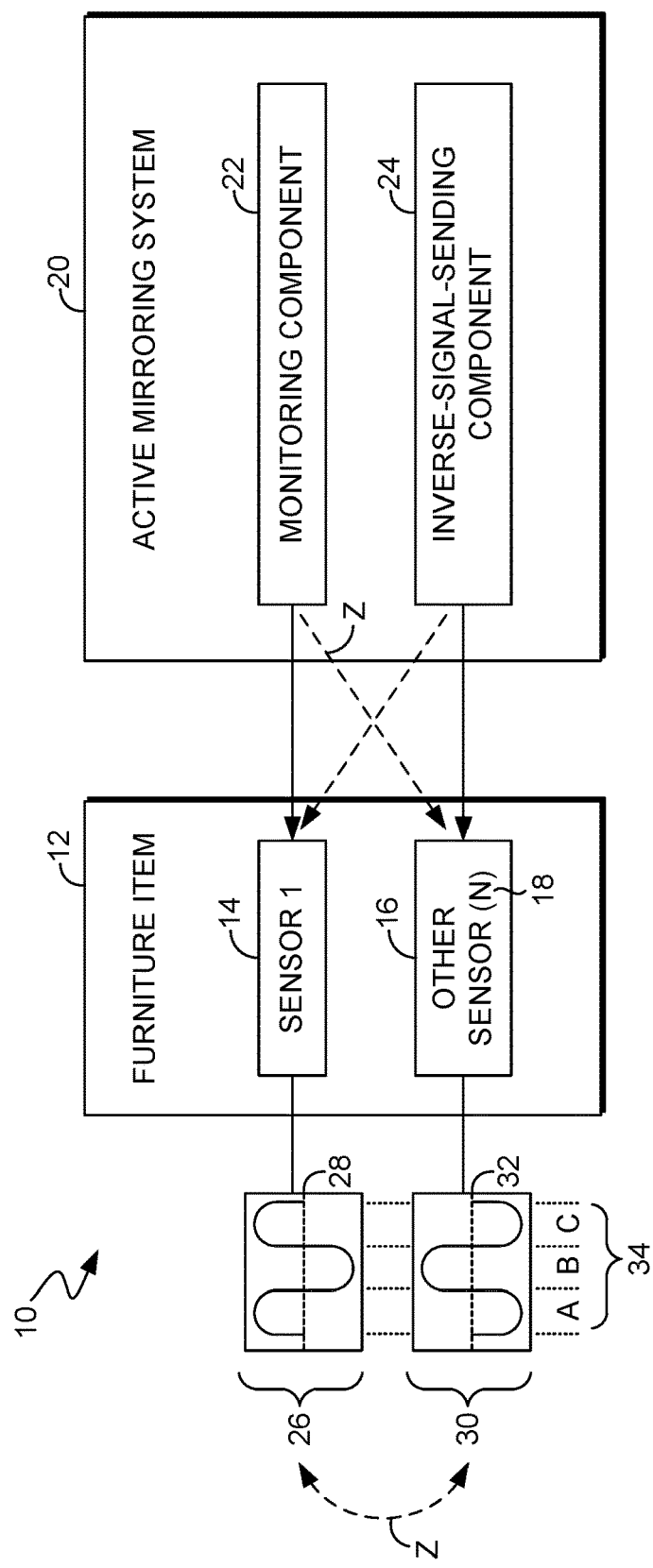
FIG. 1 is an exemplary active-mirroring, capacitance monitoring system for furniture sensing of at least one furniture item, in accordance with embodiments of the invention.

In additional embodiments, a first and second furniture item may be coupled together, forming a synchronized furniture system. In this embodiment, an active mirroring system may monitor a first sensor type on the first and second furniture items, while applying a mirrored frequency to additional types of sensors on the first and second furniture items. In other words, while a first pair of sensors monitoring capacitance changes across a first sensor type is actively retrieving capacitance data in association with a first monitored frequency, embodiments of the invention apply a mirrored frequency (i.e., an inverse first monitored frequency) to any additional sensors associated with the synchronized furniture items, thereby preventing cross-contamination between the first sensor type and any additional sensors Accordingly, with reference to FIG. 1, embodiments of an active-mirroring capacitive monitoring system 10 include at least one furniture item 12 coupled to an active mirroring system 20 having a monitoring component 22 and an inverse-signal-sending component 24. In embodiments, the furniture item 12 includes a first sensor type 14 and other sensors (N) 16. In some aspects, multiple other sensors 18 may be coupled to the furniture item 12 to provide multiple other sensors 18 receiving mirrored inverse frequencies from the inverse-signal-sending component 24. In one embodiment, monitoring data 26 is generated during monitoring of capacitance change with respect to the first sensor type 14, at a first sampling frequency 28. At the same time, in some aspects, mirroring data 30 is generated during mirroring of capacitance change with respect to the other sensor (N) 16, at an inverse sampling frequency 32. Accordingly, across frequency segments A, B, and C, a mirrored signal 34 is provided such that noise from additional sensors does not interfere with the monitoring across the first sensor type 14. As further shown in FIG. 1, the active mirroring capacitance monitoring may be cycled through monitoring and inverse-signal-sending phases of a repeated cycle, such that each sensor of the furniture item 12 may be sampled for capacitance change in isolation from one or more additional sensors, according to embodiments of the invention.

Figure 2A:
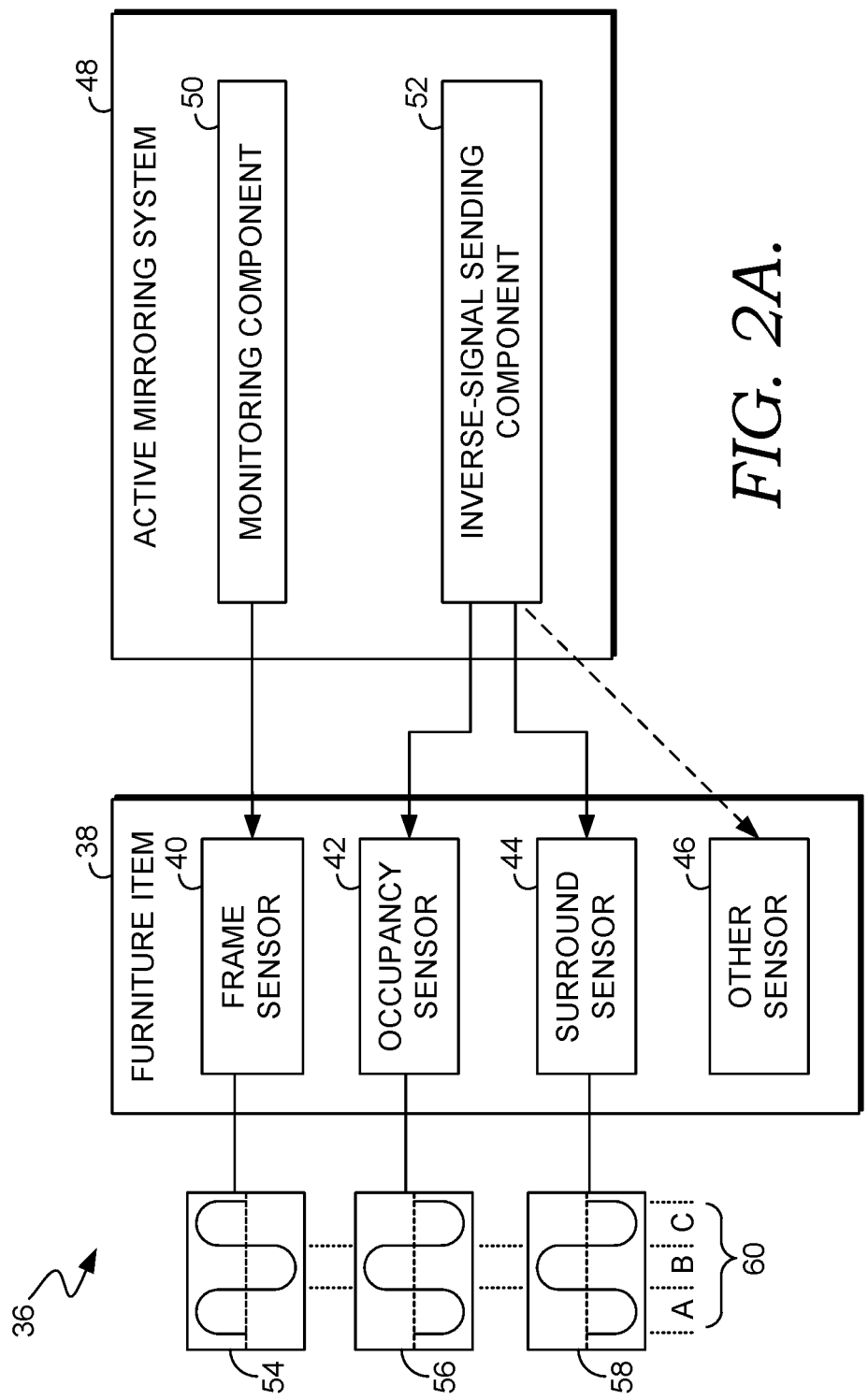
FIG. 2A is an exemplary active-mirroring, capacitance monitoring system for furniture sensing, in accordance with embodiments of the invention.

In FIG. 2A, the exemplary active mirroring capacitance monitoring system 36 includes a furniture item 38 having a frame sensor 40, an occupancy sensor 42, a surround sensor 44 and other sensors 46, which may each be cycled through capacitive monitoring and active mirroring cycles in response to sampling signals and inverse sampling signals from active mirroring system 48. In some aspects, the active mirroring system 48 includes a monitoring component 50 and an inverse-signal sending component 52 that alternate generating monitoring data 54 via monitoring of capacitance change with respect to the frame sensor 40, according to embodiments of the invention. At the same time, in some aspects, mirroring data 56 and 58 is generated during mirroring of capacitance change with respect to the occupancy sensor 42, the surround sensor 44, and/or the other sensor 46 at an inverse sampling frequency. Accordingly, across frequency segments A, B, and C, a mirrored signal 60 is provided such that noise from the occupancy, surround, and/or other sensors does not interfere with the monitoring across the frame sensor 40.

Figure 2B:
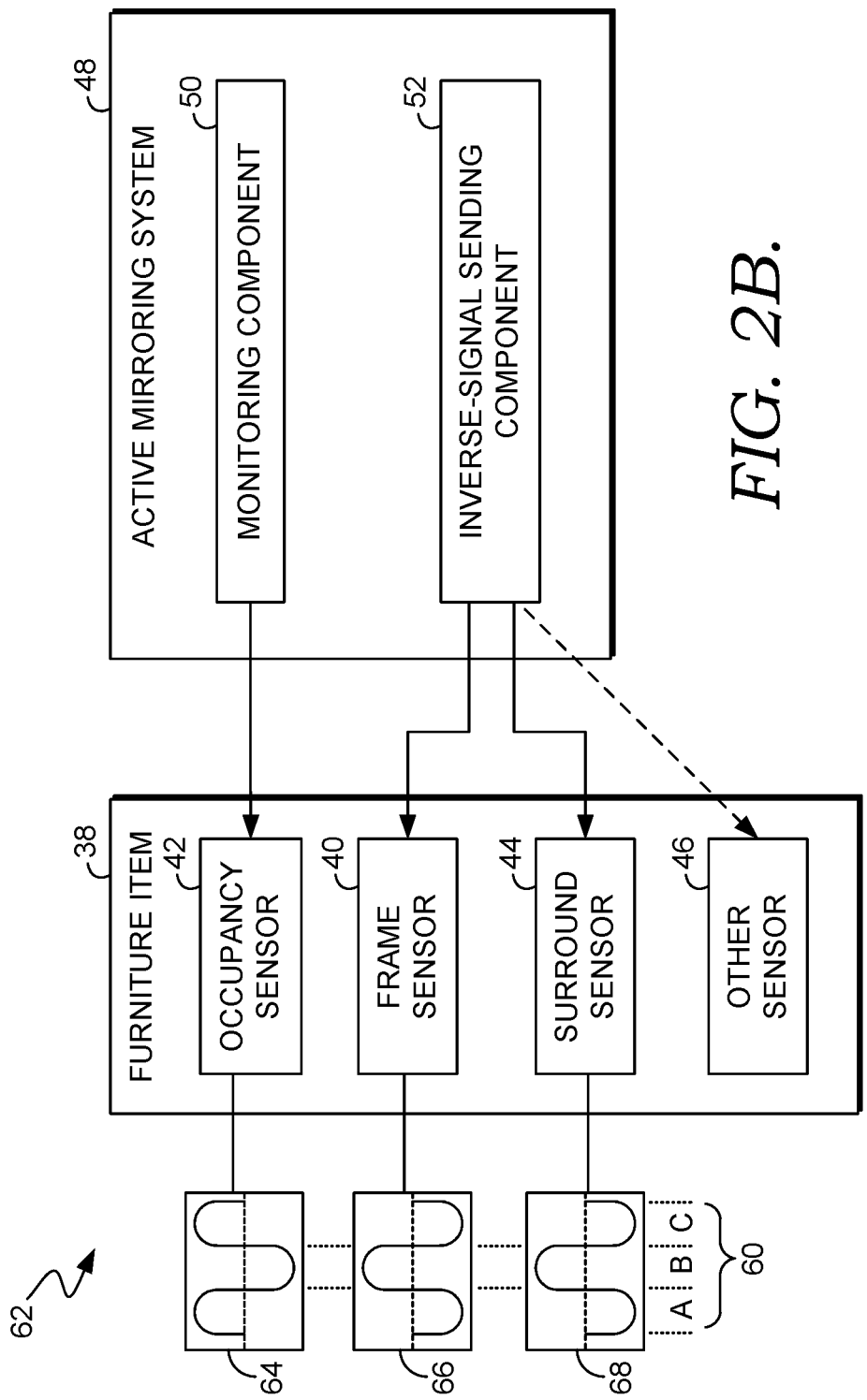
FIG. 2B is an exemplary active-mirroring, capacitance monitoring system for furniture sensing, in accordance with embodiments of the invention.
Figure 2C:
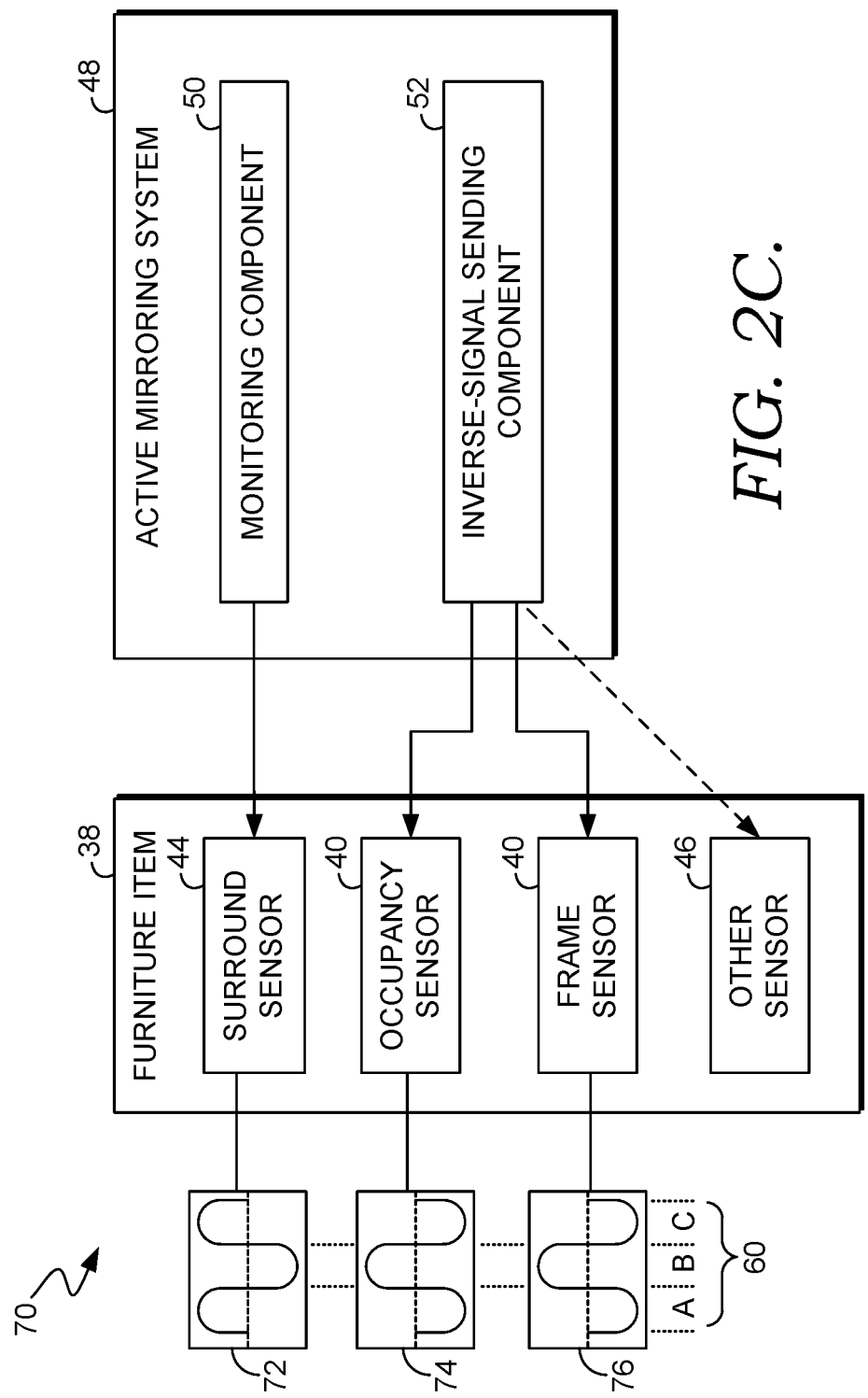
FIG. 2C is an exemplary active-mirroring, capacitance monitoring system for furniture sensing, in accordance with embodiments of the invention.

As shown in FIG. 2B, in some embodiments, active mirroring capacitance monitoring 62 may be cycled through monitoring and inverse-signal-sending phases of a repeated cycle, such that each sensor of the furniture item 38 may be sampled for capacitance changes. In embodiments of the invention, the occupancy sensor 42 is receiving a first sampling frequency from the monitoring component 50, while the frame sensor 40, surround sensor 44, and/or other sensor 46 receive inverse sampling frequencies from the inverse-signal sending component 52. Accordingly, monitoring data 64 is generated across the occupancy sensor 42, while mirroring data 66 and 68 is provided at the frame sensor 40 and the surround sensor 44. In some embodiments of the invention, additional sensors other than those depicted in association with monitoring data and/or mirroring data, may be coupled to the furniture item 38, such as the other sensors 46. In this aspect, based on a type of sensor of the other sensors 46, during monitoring of the occupancy sensor 42, the inverse signal-sending component 52 may or may not provide an inverse sampling signal to the other sensor 46, as both non-interruptive and interrupting additional sensors of the furniture item 38 are within the scope of the invention. In some aspects of the invention, the active mirroring system 48 may be a capacitance monitoring component for generating uninterrupted sensing, thereby only providing sampling signals and inverse sampling signals to the corresponding capacitance sensing mechanisms of the furniture item 38. In some embodiments, one or more other sensors 46 may utilize different technologies that do not interfere with the capacitance monitored sensor, or may be insulated from the adjacent sensors and therefore not creating interference with other sensors of the same or different type, in some aspects of the invention.

Continuing with the alternating monitoring of FIGS. 2A and 2B, as shown in 2C, an active mirroring capacitance monitoring system may generate monitoring data 72 across the surround sensor 44, and mirrored data 74 and 76 across the occupancy sensor 42 and the frame sensor 40. Additionally, during cycling between multiple types of sensors being monitored and mirrored on the furniture item 38, in some embodiments, the other sensor 46 may receive an inverse sampling signal based on the type of surround sensor 44 and/or the proximity of the other sensor 46 with respect to the surround sensor 44. In other words, the active mirroring capacitance monitoring system 70 may provide an inverse sampling signal from the inverse-signal sending component 52 to the non-monitored sensor components of the furniture item 38 that could potentially interfere with the capacitance monitoring of a sensor receiving a sampling signal via the monitoring component 50, according to embodiments of the invention.

The sampling and mirroring across multiple sensors of a furniture item may be generated in sequence, such as a cycle of capacitance monitoring across multiple capacitive sensors of a monitored furniture item. Accordingly, embodiments of the invention provide a system and method for rapidly monitoring multiple different types of sensors, for threshold duration of sample time and within threshold proximity to additional sensor sampling. For example, an active mirroring sampling system may activate a first sensor type by applying a sampling signal from a monitoring component to the first sensor type, while at the same time, applying an inverse sampling signal from an inverse-signal sending component to the second sensor type. Such simultaneous sensing and blocking may take place within milliseconds of sample time, while alternating between multiple sensing elements of the furniture item for subsequent samples over milliseconds of time. Accordingly, after a first incremental sampling of the first sensor type, a second incremental sample of capacitance monitoring may be taken with respect to a second sensor type via the monitoring component of the active mirroring system, while at the same time, applying an inverse sampling signal from an inverse-signal sending component to the first sensor type.

In one aspect, a furniture item may have multiple capacitive sensors that are generating capacitance monitoring data (i.e., "listening" for different changes in capacitance levels with respect to different capacitive sensing mechanism coupled to different portions of a furniture item), with each of the multiple capacitive sensors being sampled for a change in capacitance upon receiving a sampling signal from the monitoring component of the active mirroring system. In this aspect, each portion of the furniture item may be monitored for capacitance change at the same time, or in close duration (e.g., within milliseconds of time between different sensor sampling) such that a single contact event adding voltage change across a single monitored capacitor may be detectable without interference from additional sensors. As such, a single contact event may include a frame touch from a user that triggers an indication of presence with respect to a frame capacitive sensor of the furniture item frame. In this example, without active mirroring of the additional sensors on the furniture item (e.g., the surround capacitive sensor, the occupancy capacitive sensor, and/or any additional other capacitive sensors or other types of sensors that may otherwise interfere with detection via the currently monitored frame sensor), a false indication of contact with the frame may be triggered from a detected level of capacitance received as noise from another sensor on the furniture item, which may be cancelled and/or dampened using one or more features of the active mirroring system.

Figure 3:
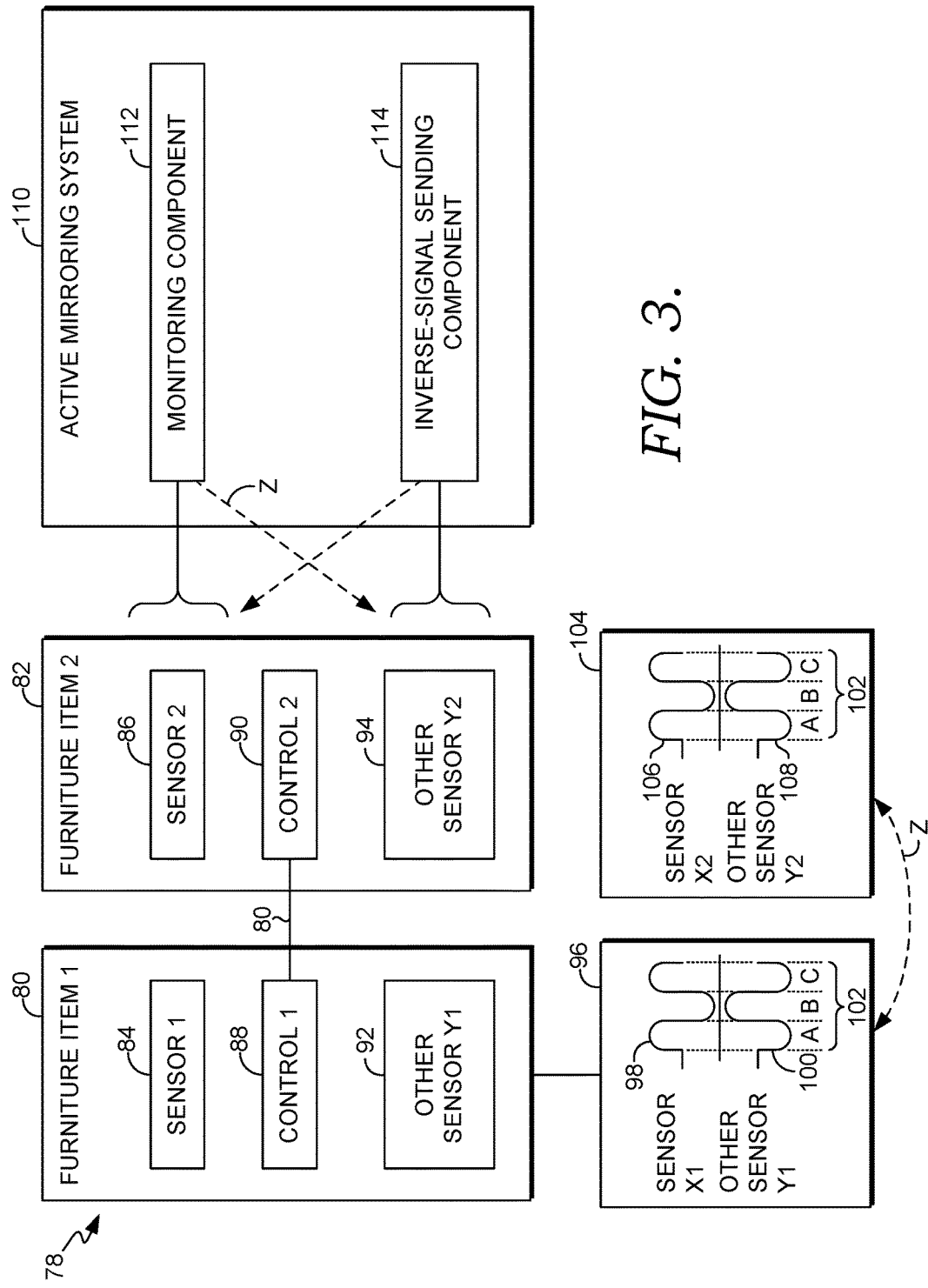
FIG. 3 is an exemplary active-mirroring system for furniture sensing of two or more furniture items, in accordance with embodiments of the invention.
Figure 4:
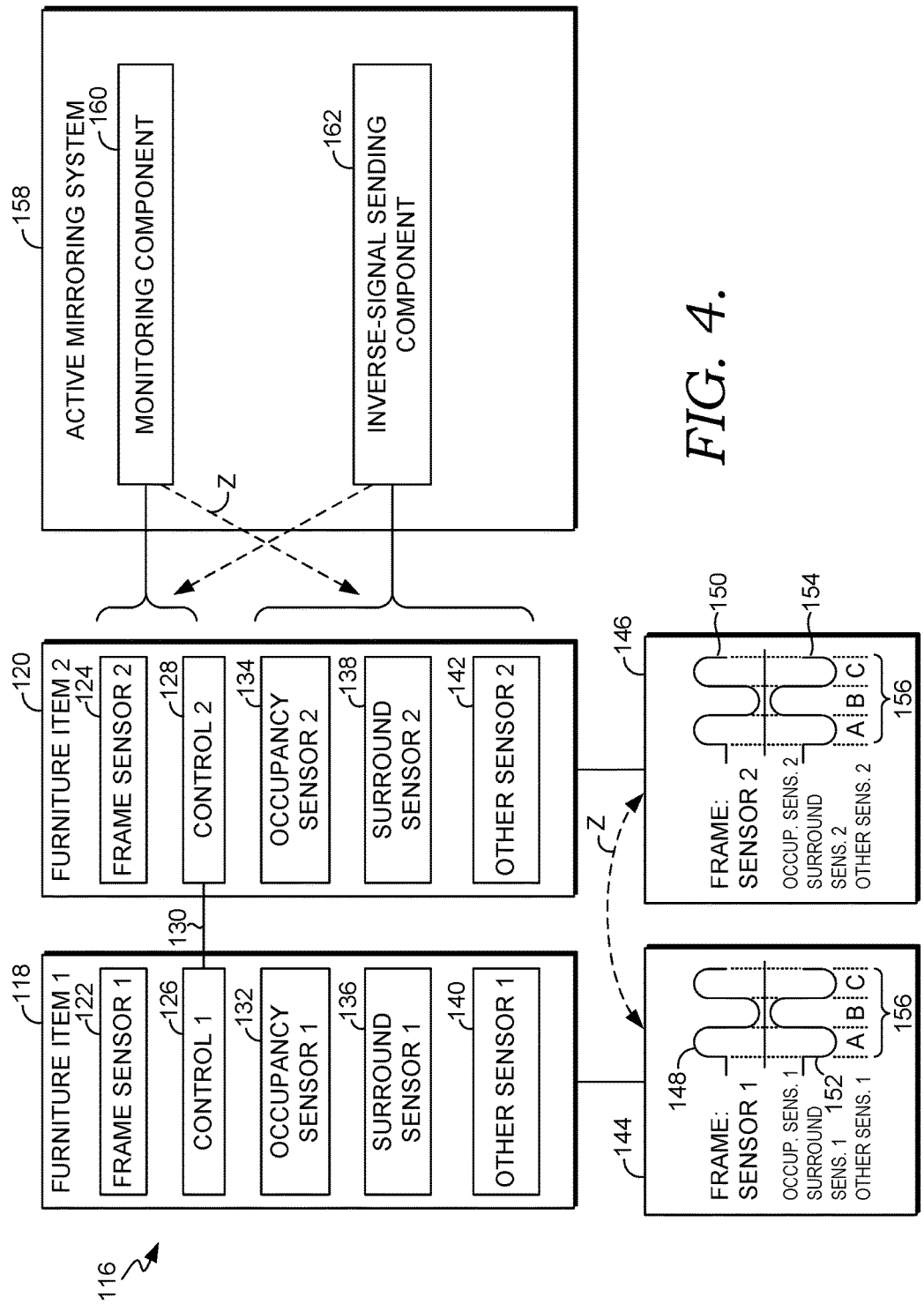
FIG. 4 is an exemplary active-mirroring system for furniture sensing of two or more furniture items, in accordance with embodiments of the invention.

In FIG. 3, an exemplary active mirroring capacitive monitoring system 78 includes a first furniture item 80 having a first sensor type X 84, a second furniture item 82 having a corresponding first sensor type X 86 (e.g., a frame sensor on the first and second furniture items). Embodiments of the system 78 further include a pair of synchronized control components 88 and 90 that may be doubled directly or indirectly over connection 80, which may be wired, wireless, or another type of coupling connection between the two furniture items 80 and 82. In embodiments of the invention, each furniture item has an "other sensor" 92 and 94 that may be any other capacitive sensor coupled to the synchronized furniture items 80 and 82. In some aspects, monitoring data 96 and 104 indicates the applied sensing frequency 98 and 106 that may be offset against an inverse sensing frequency 100 and 108 during one or more cycles 102 of active mirroring. Although depicted with counteracting phases A, B, and C, it should be understood that a duration of sample time, number of phases in a cycle 102, and/or threshold level of frequency required during monitoring and/or mirroring is not limited by the examples of FIG. 3.

In some aspects, the active mirroring system 110 provides similar functionality as that discussed above in a single furniture item system, as both the synchronized/paired furniture items 80 and 82 are receiving a sampling/monitoring signal at a first sensor type 84 and 86 via the monitoring component 112, while at least one other sensor 92 and 94 is receiving an inverse sampling/monitoring signal via the inverse signal-sending component 114. In aspects, a pair of automated furniture items, such as a pair of articulating, adjustable bed frames and platforms, may both include two or more sensors that utilize capacitive monitoring data to determine whether a threshold change in capacitance has taken place. In this example, a first type of capacitive sensor on the paired beds (e.g., one frame sensor on the first bed, one frame sensor on the second bed, both frames moving in synchronized motion based on coupling of the pair of beds), may potentially be impacted from changes in voltage detected across other capacitive sensing features of the paired beds, such as the second capacitive sensor type of the paired beds (e.g., one occupancy sensor on the first bed, one occupancy sensor on the second bed, both occupancy sensors generating occupancy detection data in tandem based on coupling of the pair of beds). To prevent interruption of the first sensor type capacitive monitoring, the active mirroring system provides a sampling frequency to the first sensor type, and provides an inverse sampling frequency to the second sensor type. With active mirroring of the second sensor type, in some embodiments, uninterrupted signal detection may take place with respect to presence detection of the paired furniture frames. In some aspects, what is meant by uninterrupted signal detection is that a first sensor type may be monitored for capacitance changes while the second sensor type may not generate signaling noise that interferes during first-sensor sampling. The system may then alternate and/or cycle through a different mirrored process, monitoring capacitance changes with respect to the second sensor type using a sampling frequency, and mirroring such data collection with an inverse sampling frequency directed to the first sensor type. In this example, the second sensor type may retrieve uninterrupted capacitance monitoring data while the inverse sampling frequency value applied to the first sensor type maintains uninterrupted monitoring of the second sensor type.

Similarly, as shown in the active mirroring system 116 of FIG. 3, the first furniture item 118 and paired/synchronized second furniture item 120 are monitored and mirrored in tandem and according to sensor type. For example, the frame sensor 122 and 124 of each furniture item 118 and 120 receives a first sampling signal from the monitoring component 160, while the additional occupancy sensors 132 and 134, surround sensors 136 and 138, and other sensors 140 and 142, receive an inverse first sampling signal from the inverse signal-sending component 162. In further aspects, the monitoring data 144 and 146 depicts the same sensing data 148 and 150 collected in opposition to the mirrored and/or cancelled other-sensor data 152 and 154 receiving inverse signal sampling frequencies during one or more cycles 156 of active mirroring, rotating along a sequential Z path at the active mirroring system 158 between the monitoring component 160 and the inverse-signal sending component 162.

Figure 5:
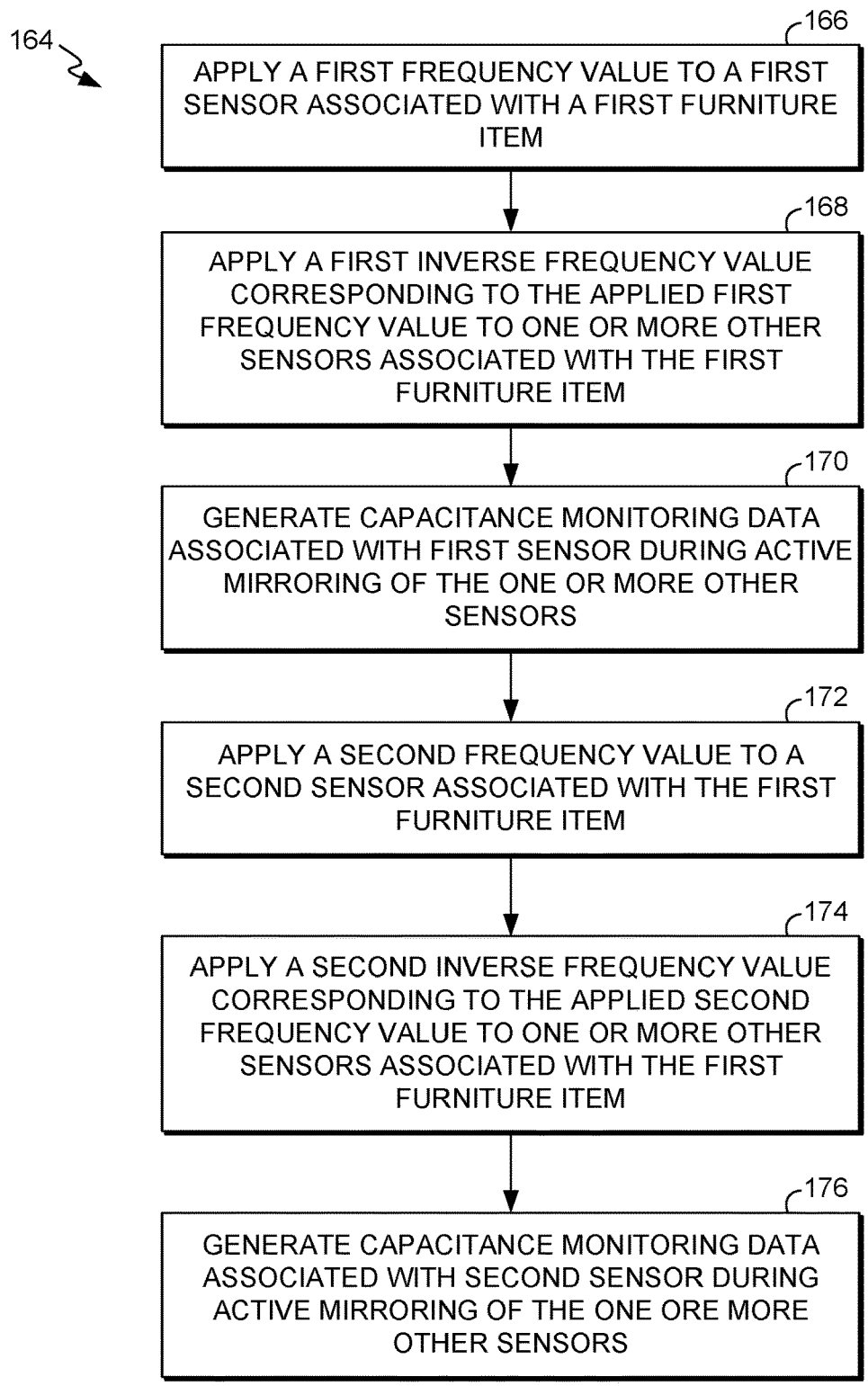
FIG. 5 is an exemplary flow diagram for a method of furniture sensing with an active-mirroring system, in accordance with embodiments of the invention.

Turning next to FIG. 5, an exemplary method for active mirroring capacitance monitoring 164 is provided. In some aspects, at block 166, a first frequency value is applied to a first sensor associated with a first furniture item. In further embodiments, at block 168, a first inverse frequency value corresponding to the applied first frequency value is applied to one or more other sensors associated with the first furniture item. At block 170, capacitance monitoring data is generated, associated with the first sensor during active mirroring of the one or more other sensors. A second frequency value is then applied to the second sensor associated with the first furniture item, in some embodiments, at block 172. As such, although a first sampling frequency may be used to monitor capacitance change over a first sensor type, in later sampling, a second sampling frequency may be used to monitor capacitance change over a second sensor type, based on one or more other factors, such as a location of the sensor on the frame, a rate of change of baseline capacitance change of the furniture item, and other factors impacting a sampling frequency and/or inverse sampling frequency for applying during capacitive detection monitoring. At block 174, a second inverse frequency value corresponding to the applied second frequency value is applied to one or more other sensors associated with the first furniture item. At block 176, capacitance monitoring data associated with a second sensor is generated during active mirroring of the one or more other sensors.

Figure 6:
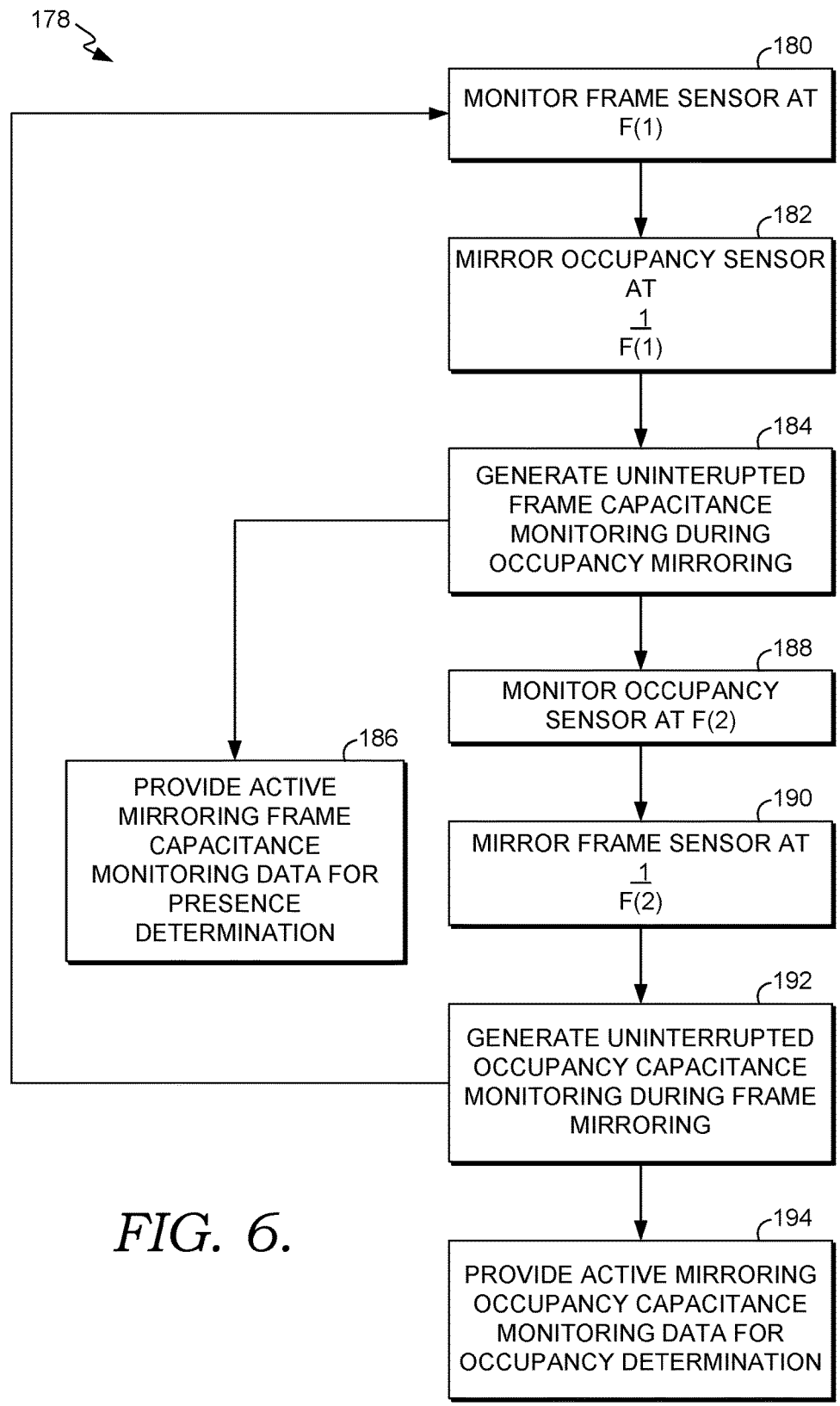
FIG. 6 is an exemplary flow diagram for a method of furniture sensing with an active-mirroring system, in accordance with embodiments of the invention.

With reference finally to FIG. 6, an exemplary active mirroring capacitance monitoring method 178 is provided. At block 180, a frame sensor is monitored at a first frequency, while at block 182, an occupancy sensor of the same furniture item is mirrored at an inverse first frequency value. In other words, for capacitive monitoring of the frame sensor, a particular frequency ($F(1)$) is applied across the capacitor of such frame sensor. In embodiments, to cancel out the potentially interfering noise from the occupancy sensor, an inverse value of the sampling frequency ($1/(F(1))$) is applied to the occupancy sensor, cancelling interference from the occupancy sensor. In some aspects, at block 184, uninterrupted frame capacitance monitoring data is generated during occupancy mirroring (i.e., $F(1)$ sent to the frame sensor, and $1/F(1)$ sent to the occupancy sensor). At block 186, such active mirroring frame capacitance monitoring data may be provided for a resulting presence determination. For example, a furniture frame sensor undergoing monitoring at block 180, may provide an indication of change in capacitance that is output at block 186, while the cycle of the monitoring method 178 continues.

Accordingly, at block 188, the occupancy sensor is monitored at a second frequency ($F(2)$), while at block 190, the frame sensor is mirrored at $1/F(2)$. In some embodiments, uninterrupted occupancy capacitance monitoring data is generated during frame mirroring at block 192, which may be provided at block 194 such that active mirroring occupancy capacitance monitoring data for occupancy determination is provided. Although depicted here as cycling between a first and second sensor type, alternating monitoring and mirroring of each, in some aspects, the active mirroring capacitance monitoring of multiple sensors on a single furniture item or on paired/synchronized furniture items may include more than two capacitive sensor types. Further, it shall be understood that the magnitude of frequency for sampling may be sensor-specific, with a particular frame sensor sampling frequency being applied, and an inverse frame sensor frequency used for mirroring. Similarly, a sensor-specific occupancy sensor sampling frequency may be used for monitoring, while an inverse occupancy sensor frequency is used in mirroring one or more additional capacitive sensors, generating both uninterrupted capacitive monitoring of the primary sensing element, but also providing sensor-specific inverse signals to the corresponding mirrored components.

From the foregoing, it will be seen that this invention is one well adapted to attain all the ends and objects hereinabove set forth together with other advantages, which are obvious and which are inherent to the structure. It will be understood that certain features and subcombinations are of utility and may be employed without reference to other features and subcombinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The invention claimed is:

1. A method of monitoring, by a computing device having a processor and a memory, at least one capacitance change associated with a capacitive sensor of a plurality of capacitive sensors coupled to at least one furniture item, wherein the method comprises:
   monitoring a capacitance change associated with at least one first sensor type at a first sampling frequency, and mirroring a capacitance change associated with at least one second sensor type at an inverse first sampling frequency;
   monitoring a capacitance change associated with at least one second sensor type at a second sampling frequency and mirroring a capacitance charge associated with at least one first sensor type at an inverse second sampling frequency; and
   continuing alternating between
      (1) monitoring the at least one first sensor type at the first sampling frequency and mirroring the at least one second sensor type at the inverse first sampling frequency; and
      (2) monitoring the at least one second sensor type at the second sampling frequency and mirroring the at least one first sensor type at the inverse second sampling frequency,
      to provide a continuous monitoring of capacitance change with respect to the first sensor type and the second sensor type of the at least one furniture item.

2. The method of claim 1, wherein the at least one furniture item comprises a first furniture item coupled to a second furniture item.

3. The method of claim 1, wherein each of the first and second furniture items comprises a plurality of synchronized sensor types.

4. The method of claim 1, wherein the inverse first sampling frequency comprises a frequency value cancelled by an applied first sampling frequency of an opposite magnitude with respect to a baseline first monitored capacitance data,
   and further wherein the inverse second sampling frequency comprises a frequency value cancelled by an applied second frequency of an opposite magnitude with respect to a baseline second monitored capacitance data.

5. The method of claim 4, wherein the first sampling frequency corresponds to at least one of:
   a location on the furniture item of the at least one first sensor type;
   a proximity of the at least one first sensor type to another sensor type on the furniture item;
   a signal strength of the first sensor type;
   a signal strength of a sensor type other than the first sensor type;
   an amount of baseline interference with a sampling of capacitance via the first sensor type; and
   an amount of baseline interference with a mirroring of capacitance via another sensor type.

6. An active mirroring system for capacitance monitoring, comprising:
   at least one first sensor type coupled to at least one furniture item, the at least one first sensor type comprising a first conductive component configured to monitor a change in capacitance with respect to at least a first portion of the furniture item;
   at least one second sensor type coupled to the at least one furniture item; the at least one second sensor type comprising a second conductive component configured to monitor a change in capacitance with respect to at least a second portion of the furniture item, said second portion separate from said first portion; and
   a computing device having a processor and a memory that stores instructions, wherein execution of the instructions causes the processor to:
      (1) apply a sampling frequency to the at least one first sensor type coupled to the at least one furniture item;
      (2) apply an inverse sampling frequency to the at least one second sensor type coupled to the at least one furniture item;
      (3) generate at least one capacitance monitoring indication from the at least one first sensor type; and
      (4) provide the received at least one capacitance monitoring indication to be utilized to determine whether a capacitance threshold is satisfied for the at least one first sensor type.

7. The system of claim 6, wherein upon providing the received at least one capacitance indication associated with the at least one first sensor type, the execution of instructions further causes the processor to:
   1) apply a second sampling frequency to the at least one second sensor type coupled to the at least one furniture item;
   2) apply an inverse second sampling frequency to the at least one first sensor type coupled to the at least one furniture item;
   3) generate at least one capacitance monitoring indication from the at least one second sensor type; and
   4) provide the received at least one capacitance monitoring indication to be utilized to determine whether a capacitance threshold is satisfied for the at least one second sensor type.

8. The system of claim 7, wherein execution of the instructions further causes a repeated sample cycle of capacitance monitoring comprising the at least one first sensor type and the at least one second sensor type, wherein a sequence of the repeated sample cycle comprises alternating steps of:
   1) monitoring the at least one first sensor type and mirroring the at least one second sensor type; and
   2) monitoring the at least one second sensor type and mirroring the at least one first sensor type.

9. The system of claim 7, wherein the at least one first sensor type comprises one of a furniture frame sensor, a furniture surround sensor, and a furniture occupancy sensor.

10. The system of claim 7, wherein the at least one second sensor type comprises one of a furniture frame sensor, a furniture surround sensor, and a furniture occupancy sensor.

11. The system of claim 7, wherein the at least one furniture item comprises an automated bed having an articulating frame and a plurality of adjustable support platforms corresponding to the articulating frame.

12. The system of claim 11, wherein the at least one first sensor type comprises a frame sensor coupled to at least a portion of the articulating frame, and further wherein the at least one second sensor type comprises an occupancy sensor coupled to at least a portion of the plurality of adjustable support platforms,
   wherein the at least one first sensor type is configured to monitor a change in presence with respect to the articulating frame based on an increase or decrease in a detected change in voltage via a first sensor type capacitive monitoring component, and further wherein the at least one second sensor type is configured to monitor occupancy with respect to the plurality of adjustable support platforms based on an increase or decrease in a detected change in voltage via a second sensor type capacitive monitoring component.

13. The system of claim 7, wherein the at least one furniture item comprises at least one third sensor type, said at least one third sensor type comprising one of a furniture frame sensor, a furniture surround sensor, and a furniture occupancy sensor, wherein upon applying a sampling frequency to the at least one first sensor type coupled to the at least one furniture item, an inverse sampling frequency is applied to the at least one third sensor type, and further wherein upon applying a sampling frequency to the at least one second sensor type coupled to the at least one furniture item, an inverse sampling frequency is applied to the at least one third sensor type, and upon applying an inverse sampling frequency to the at least one first sensor type and the at least one second sensor type, a sampling frequency is applied to the at least one third sensor type.

14. The system of claim 13, wherein execution of the instructions further causes a repeated sample cycle of capacitance monitoring comprising the at least one first sensor type, the at least one second sensor type, and the at least one third sensor type, wherein a sequence of the repeated sample cycle comprises alternating steps of:
1) monitoring the at least one first sensor type and mirroring the at least one second sensor type and at least one third sensor type;
2) monitoring the at least one second sensor type and mirroring the at least one first sensor type and at least one third sensor type; and
3) monitoring the at least one third sensor type and mirroring the at least one first sensor type and the at least one second sensor type.

15. The system of claim 13, wherein the at least one first sensor type comprises a furniture frame capacitive sensor, the at least one second sensor type comprises an occupancy capacitive sensor, and the at least one third sensor type comprises a surround sensor.

16. An active-mirroring apparatus for capacitive-sensor furniture monitoring, said active-mirroring apparatus comprising:
a monitoring component for receiving an indication of change in capacitance with respect to a first capacitive sensor type coupled to each of two or more synchronized furniture items, wherein the capacitance change with respect to the first capacitive sensor type on each of the two or more synchronized furniture items is received in response to an applied first sampling frequency from the active mirroring apparatus; and
an active-mirroring component for cancelling noise interference from at least one other capacitive sensor type coupled to each of the two or more synchronized furniture items during, wherein the noise interference from the at least one other capacitive sensor type is cancelled at least in part in response to an inverse first sampling frequency from the active mirroring apparatus.

17. The active-mirroring apparatus of claim 16, wherein the at least two synchronized furniture items comprises a pair of automated furniture items having corresponding first and second sensor types, wherein the pair of automated furniture items comprises a first furniture item control component coupled to a second furniture item control component.

18. The active-mirroring apparatus of claim 16, wherein the first sampling frequency comprises a first frequency value and the second sampling frequency comprises a second frequency value different from the first frequency value.

19. The active-mirroring apparatus of claim 16, wherein cancelling noise interference from the at least one other capacitive sensor type comprises:
determining a sensor type for each of the at least one other capacitive sensor types; and
applying a sensor-specific noise-cancelling signal to each of the at least one other capacitive sensor types.

20. The active-mirroring apparatus of claim 16 further comprising a sample cycling component configured to cycle a capacitive monitoring phase of a monitoring component and a noise-cancelling phase of the inverse-signal sending component in repeated succession to provide a consistently monitored and consistently cancelled, alternating active mirroring system.

\* \* \* \* \*